US010248323B2

(12) United States Patent
Cherubini et al.

(10) Patent No.: US 10,248,323 B2
(45) Date of Patent: Apr. 2, 2019

(54) NON-VON NEUMANN OPTIMIZATION BASED ON APPROXIMATE MESSAGE PASSING

(71) Applicant: International Business Machines Corporation, Armonk, NY (US)

(72) Inventors: Giovanni Cherubini, Rueschlikon (CH); Manuel Le Gallo, Zurich (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 15/274,340

(22) Filed: Sep. 23, 2016

(65) Prior Publication Data

US 2018/0088801 A1    Mar. 29, 2018

(51) Int. Cl.
*G06F 3/06* (2006.01)
*G11C 13/00* (2006.01)

(52) U.S. Cl.
CPC ............ *G06F 3/061* (2013.01); *G06F 3/0604* (2013.01); *G06F 3/064* (2013.01); *G06F 3/0679* (2013.01); *G11C 13/004* (2013.01); *G11C 13/0069* (2013.01)

(58) Field of Classification Search
CPC ............................ G06F 17/30536; G06F 17/16
See application file for complete search history.

(56) References Cited

U.S. PATENT DOCUMENTS

| 9,318,194 | B1 | 4/2016 | Siau et al. |
| 2015/0170025 | A1* | 6/2015 | Wu ....................... G06N 3/0445 706/25 |
| 2016/0012876 | A1 | 1/2016 | Di Ventra et al. |

(Continued)

OTHER PUBLICATIONS

Indiveri et al, "Inegration of nanoscale memristor synapes in neuromorphic computing architectures", arXiv:1302.7007v1 [cs. ET] Feb. 27, 2013, pp. 1-22.

(Continued)

*Primary Examiner* — Tuan V Thai
*Assistant Examiner* — Alexander J Yoon
(74) *Attorney, Agent, or Firm* — Scully, Scott, Murphy & Presser, P.C.; Daniel Morris, Esq.

(57) ABSTRACT

A computing system having a computational memory and a method configured to perform computations using an approximate message passing process. The system exploits memcomputing which is a prominent non-von Neumann computational approach expected to significantly improve an energy efficiency of computing systems. The computational memory includes at least one memristive array comprising a plurality of memristive devices arranged in a crossbar topology and the computing system may further comprise digital combinational control circuitry adapted to perform read and write operations on the at least one memristive array and to store at least one state variable of the approximate message passing process. An output of the at least one memristive array represents a result of a computation of the approximate message passing process. The control circuitry may comprise circuitry to iteratively perform computations that may not require high precision.

19 Claims, 8 Drawing Sheets

(56) References Cited

U.S. PATENT DOCUMENTS

2017/0316827 A1* 11/2017 Ge ................... G11C 13/0069

OTHER PUBLICATIONS

Traversa et al., "Universal Memcomputing Machines", arXiv:1405.0931v2 [cs.NE] Nov. 12, 2014. pp. 1-14.
Fletcher et al., "Neural Reconstruction with Approximate Message Passing (NeuRAMP)", NIPS'11 Proceeding of the 24th International Conference on Neural Information Processing Systems, Dec. 12-Dec. 17, 2011, pp. 1-9.

* cited by examiner

FUNCTION NODES    VARIABLE NODES

*MEANS OF MESSAGES:*

NON-VON NEUMANN OPTIMIZATION BASED ON APPROXIMATE MESSAGE PASSING

BACKGROUND

The present disclosure relates to performing computations using computational memory adapted to perform computations using an approximate message passing process.

Many conventional computing systems utilize a von Neumann architecture, in which a central processing unit (CPU) including an arithmetic logic unit (ALU) performs computations and may interact with a separate memory unit that provides storage. However, in recent years, the need for alternative architectures has become apparent. The logic supply voltage has been reduced and thus frequency scaling has slowed. To continue the growth predicted by Moore's law, circuit designers have turned to multicore chips and parallelism. However, such solutions may consume relatively large amounts of energy per computation, which may negatively impact the energy efficiency of the computing system.

Memcomputing is a computational paradigm where the computation and logic co-exist in the so-called computational memory. The memcomputing paradigm can address some important computational tasks with high areal/power efficiency.

Accordingly, a need arises for techniques by which computations may be performed using memcomputing that may provide improved energy efficiency of the computing system.

SUMMARY

A system, method and computer program product provides the capability to perform computations using memcomputing that may provide improved energy efficiency of the computing system. Memcomputing is a prominent non-von Neumann computational approach that is expected to significantly improve the energy efficiency of computing systems.

For example, in an embodiment of the present disclosure, a computing system may comprise computational memory adapted to perform computations using an approximate message passing process. The computational memory may comprise at least one memristive array comprising a plurality of memristive devices arranged in a crossbar topology and the computing system may further comprise digital combinational control circuitry adapted to perform read and write operations on the at least one memristive array and to store at least one state variable of the approximate message passing process, wherein an output of the at least one memristive array represents a result of a computation of the approximate message passing process. The control circuitry may comprise circuitry to iteratively perform computations using the at least one memristive array to compute the at least one state variable. The at least one memristive array may comprise circuitry adapted to compute at least one message of the approximate message passing process. The at least one memristive array may comprise a first block adapted to compute an intermediate message and a second block adapted to compute the at least one message of the approximate message passing process. The at least one memristive array may comprise circuitry adapted to compute an intermediate message and the control circuitry comprises circuitry to compute the at least one message of the approximate message passing process. The computational memory and the digital combinational circuitry may be implemented as discrete interconnected components. The computational memory and the digital combinational circuitry may be integrated into a single chip. The computational memory may comprise an array of resistive memory elements having resistance or conductance values stored therein, the respective resistance or conductance values being programmable.

In an embodiment, a computer program product for performing computation may comprise a non-transitory computer readable storage having program instructions embodied therewith, the program instructions executable by a computer, to cause the computer to perform a method comprising performing read and write operations on a computational memory, wherein the computational memory comprises at least one memristive array comprising a plurality of memristive devices arranged in a crossbar topology, performing an approximate message passing process computation using the at least one memristive array, and outputting from the at least one memristive array a result of the computation of the approximate message passing process.

In an embodiment, a computer-implemented method for performing computation may comprise performing read and write operations on a computational memory, wherein the computational memory comprises at least one memristive array comprising a plurality of memristive devices arranged in a crossbar topology, performing an approximate message passing process computation using the at least one memristive array, and outputting from the at least one memristive array a result of the computation of the approximate message passing process.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION

Figure 1:
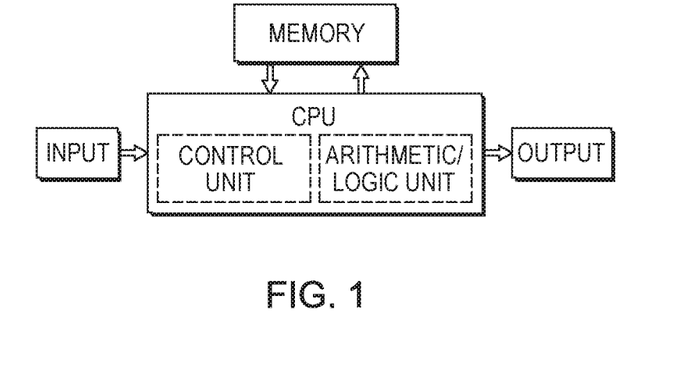
FIG. 1 is an exemplary block diagram of a von Neumann computing architecture.
Figure 2:
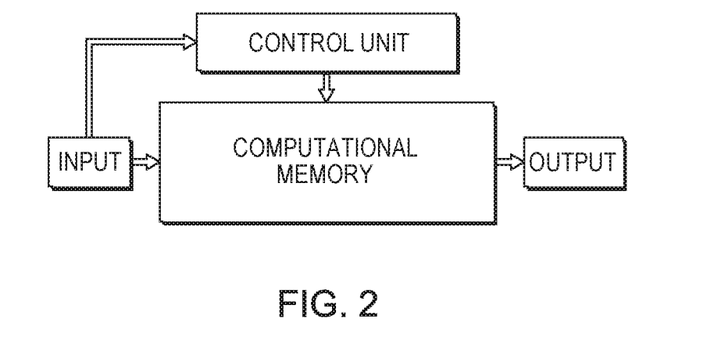
FIG. 2 is an exemplary block diagram of a memcomputing computing architecture.

In contrast to von Neumann computing architectures, an example of which is shown in FIG. 1, memcomputing is a computational paradigm where the computation and logic co-exist in the so-called computational memory. An example of the memcomputing system paradigm is illustrated in FIG. 2. In this example, the computational memory may be used to perform certain low-level computational tasks, such as finding the factors of numbers or matrix multiplications, with the processing performed entirely within the computational memory. Such computational memory may, for example, be implemented as an interconnected array of nanoscale resistive memory devices, or memristor arrays. These arrays may be made compact due to the density of the memristors within the array, and the overall energy efficiency of the devices may be better than that achieved by systems using von Neumann architectures to perform similar computations.

As another example, many computations involve the solution of systems of linear equations. To address this problem there are some well-studied and proven methods. These are divided into two main categories: direct, where the solution is given by evaluating a derived formula, and iterative where the solution is approximated based on previous results until a certain acceptable value of precision of the solution is reached. Examples of direct methods may include Cholesky factorization and Gaussian Elimination, while iterative methods include Generalized Minimal Residual Methods (GMRES), the Conjugate Gradient Method, the Minimum Residual Method (MINRES) and the Quasi-minimal residual method (QMR). For large problems, matrix and vector operations may be computationally intensive and may require significant processing time. Some important applications of systems of equations may include genetics, robotics, computer graphics and optimization problems.

Figure 3:
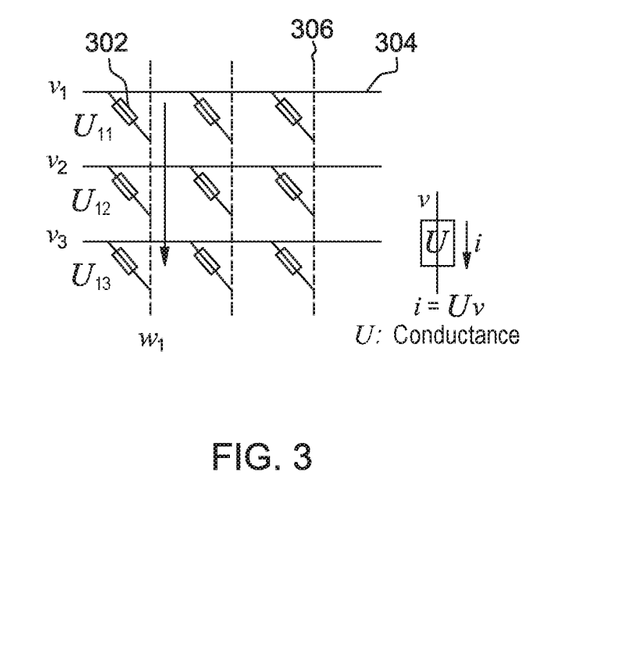
FIG. 3 is an exemplary diagram of resistive memory network.

An exemplary resistive memory network that may be used to perform matrix-vector multiplication is shown in FIG. 3. In this example, matrix-vector multiplication as shown below is performed:

$$\begin{bmatrix} U_{11} & U_{12} & U_{13} \\ U_{21} & U_{22} & U_{23} \\ U_{31} & U_{32} & U_{33} \end{bmatrix} \begin{bmatrix} v_1 \\ v_2 \\ v_3 \end{bmatrix} = \begin{bmatrix} w_1 \\ w_2 \\ w_3 \end{bmatrix} = \begin{bmatrix} U_{11}v_1 + U_{12}v_2 + U_{13}v_3 \\ U_{21}v_1 + U_{22}v_2 + U_{23}v_3 \\ U_{31}v_1 + U_{32}v_2 + U_{33}v_3 \end{bmatrix}.$$

The matrix elements $U_{11}$ to $U_{33}$ may be stored as conductance values (reciprocal of the resistance values) in an array of memristors 302. The values of the vector elements $v_1$ to $v_3$ may be applied as voltage values to input lines 304 of the memristor array. The current flowing through each memristor represents the product of the voltage applied to the memristor and the conductance value of the memristor (Ohm's Law). The currents from each memristor are collected in output lines 306, such as $w_1$, so that the total current flowing in each output line is the sum of the currents in each memristor (Kirchhoff's Law). Accordingly, the current on the first output line, $w_1$, may be given by $U_{11} v_1 + U_{12} v_2 + U_{13} v_3$, and so on for the other input and output lines. Such a resistive network may be used to calculate a matrix product for Uv=w.

Other modes of operation of memristors for performing calculations are also contemplated. For example, an accumulation dynamics based memory array may be used to calculate a matrix-vector product.

Figure 4:
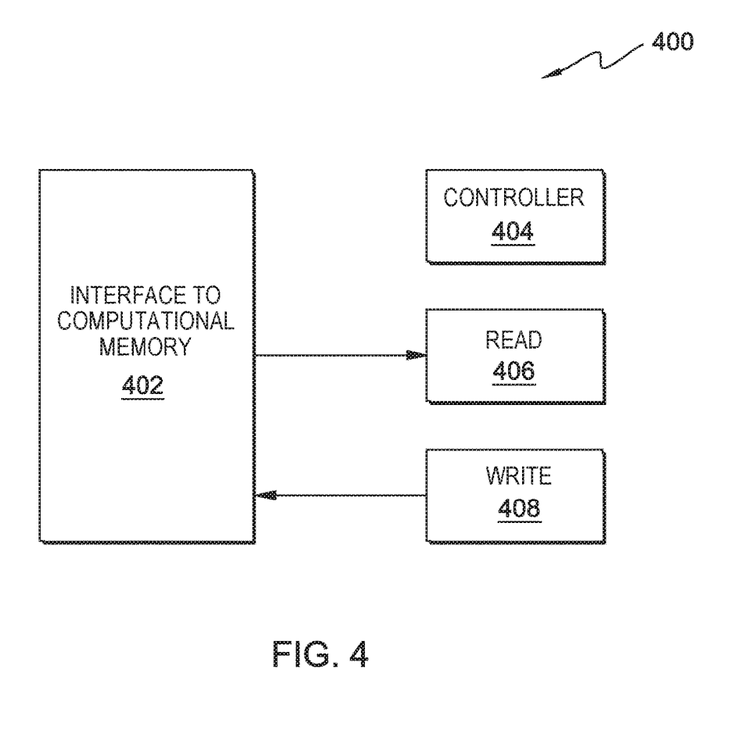
FIG. 4 is an exemplary diagram of a computational memory system, according to an embodiment of the present invention.

An exemplary computational memory system 400, according to an embodiment of the present invention, is shown in FIG. 4. Computational memory system 400 may include an interface to computational memory 402, a controller 404, read circuitry 406, and write circuitry 408. Interface to computational memory 402, may be operatively or communicatively connected to other computing hardware and may provide the capability to communicate data between the other computing hardware and computational memory 400. Controller 404 may be circuitry that controls the operation of computational memory system 400. Controller 404 may typically be implemented by circuitry including digital combinational logic. Read circuitry 406 may be circuitry that reads data from the computational memory and outputs that data. Write circuitry 408 may be circuitry that receives data to be written and writes the data to the computational memory.

Figure 5:
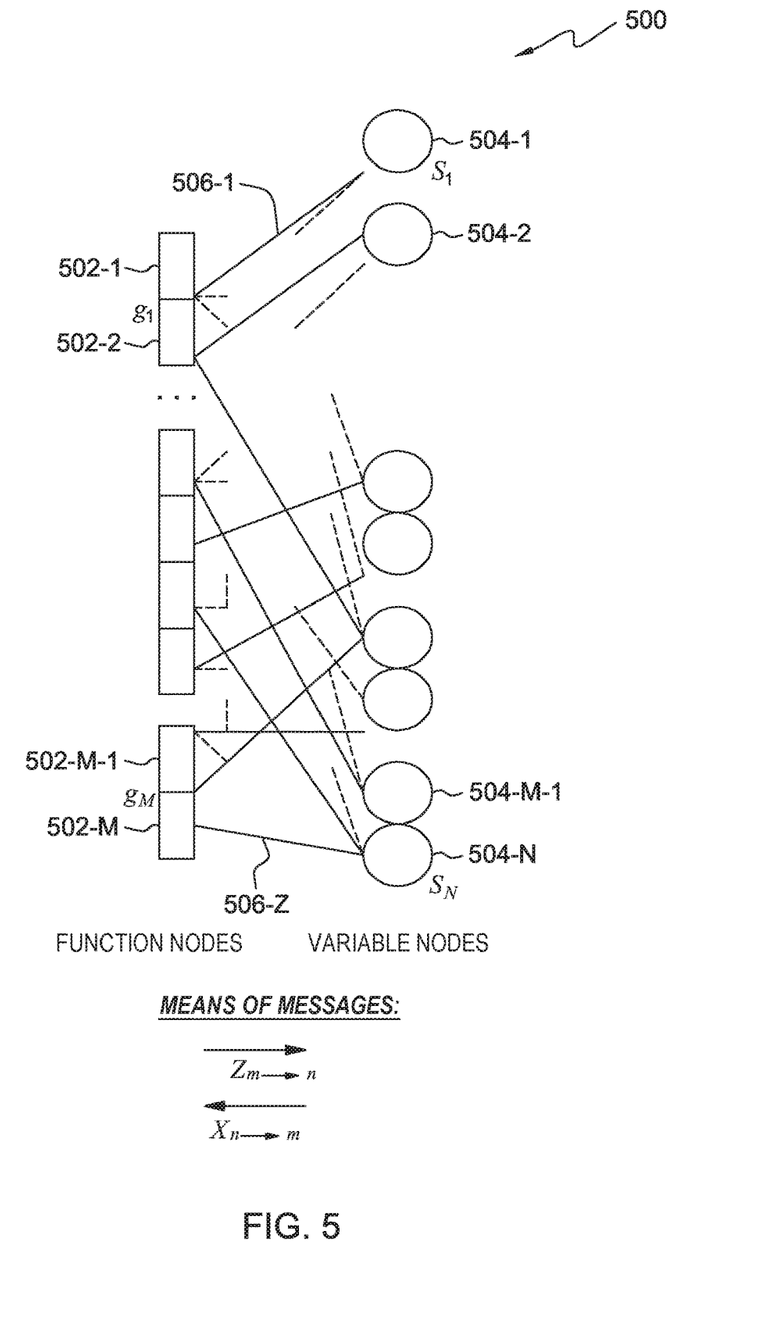
FIG. 5 is an exemplary data flow diagram of a process for a sum-product message passing computation technique.

An exemplary data flow diagram of a process 500 for a sum-product message passing technique, which may be utilized, for example, to perform matrix multiplication and solving systems of linear equations, is shown in FIG. 5. Process 500 may utilize two main types of nodes, function nodes, such as nodes 502-1 to 502-M, and variable nodes, such as nodes 504-1 to 504-N. Information messages, such as messages 506-1 to 506-Z, may be exchanged between the N variable nodes 504-1 to 504-N and the M function nodes 502-1 to 502-M. Messages 506-1 to 506-Z may take the form of probability distribution functions, which may iteratively propagate the local belief in the neighborhood of a variable. For large N, the combined effects of the messages from the variables at the function nodes may be approximated as Gaussian using central-limit theorem arguments. Each message from a function node 502-1 to 502-M to a variable node 504-1 to 504-N may also be assumed to be Gaussian. Each message may be therefore parameterized by its mean and variance only. The means and variances may be exchanged between the nodes of the factor graph until they converge.

For example, a vector $s \in \mathbb{R}^N$ may be reconstructed from a vector of linear observations $y \in \mathbb{R}^M$, such that y=As+w. $A \in \mathbb{R}^{M \times N}$ may be a known measurement matrix and $w \in \mathbb{R}^M$ may be a noise vector $$w \sim N(0, \sigma^2).$$

The message passing algorithm may be written as $$z_{m \to n}^t = y_m - \sum_{q \neq n} A_{mq} x_{n \to m}^t, \text{ and}$$

$$x_{n \to m}^{t+1} = \eta_t \left( \sum_{q \neq m} A_{qn} z_{m \to n}^t \right),$$

where $z_{m \to n}^t$ may be the mean of the message passed from a function node $g_m$ to a variable node $s_n$, $x_{n \to m}^t$ the mean of the message passed from a variable node to a function node and $\eta_t(\bullet)$ may be a function.

An approximate message passing technique (AMP) process may approximate the sum-product message passing technique in the large system limit, allowing updates of only O(N) variables instead of O(MN). For example, a first order approximate message passing technique for reconstructing s given A (Donoho et al., PNAS, 2009) may be represented as $$z^t = y - Ax^t + \frac{N}{M} z^{t-1} \langle \eta'_{t-1}(A^* z^{t-1} + x^{t-1}) \rangle,$$

$$x^{t+1} = \eta_t(A^* z^t + x^t),$$

where A* is the transpose of A, $\eta_t(\cdot)$ is a function, $\eta'_t(\cdot)$ its derivative, $\overline{(\cdot)}$ denotes the mean and $x^0=0$. The final value of x may provide the estimate of s. The AMP technique may be equivalently formulated as an iterative thresholding process, which may provide the reconstruction power of other approaches, when sparsity of the solution may be assumed, at a much lower complexity. The AMP algorithm has a relatively simple formulation and requires only multiplications and additions, making it suitable for a memristive non-von-Neumann implementation. Possible applications of the AMP technique may include compressive imaging, optimization problems arising in the fields of genetics, neuroscience, data mining, etc.

For example, the AMP technique may be used to reconstruct a random vector $$s \in \mathbb{R}^N, s_i \sim N(0, \rho^2), \forall i,$$

from a vector of linear observations $y \in \mathbb{R}^M$, where $y=As+w$, and $A \in \mathbb{R}^{M \times N}$ is a known measurement matrix. If a linear function $$\eta_t(\cdot) = \lambda_t \times (\cdot)$$

is chosen, the AMP technique may be represented as $$x^{t+1} = \lambda_t(A^* z^t + x^t),$$
$$z^t = y - Ax^t + \frac{N}{M} z^{t-1} \lambda_{t-1},$$

where A* is the transpose of A, $x^0=0$ and $$\lambda_t = \frac{1}{1+\tau_t^2}$$
$$\tau_{t+1}^2 = \sigma^2 + \frac{N}{M} \frac{\tau_t^2}{\tau_t^2+1},$$

with $$\tau_0^2 = \sigma^2 + \frac{N}{M} \rho^2.$$

Here, $z^t$ and $x^t$ are the outgoing means of the random variables associated with the g and s nodes, respectively, and $\lambda_t$ is a state variable. If $$A_{mn} \sim N\left(\frac{0.1}{M}\right)$$

(iid normalized Gaussian matrix), the convergence behavior of this algorithm may be given by $$\lim_{N \to \infty} \frac{1}{N} \|x^t - s\|^2 = (\tau_t^2 - \sigma^2) \frac{M}{N}.$$

Figure 6:
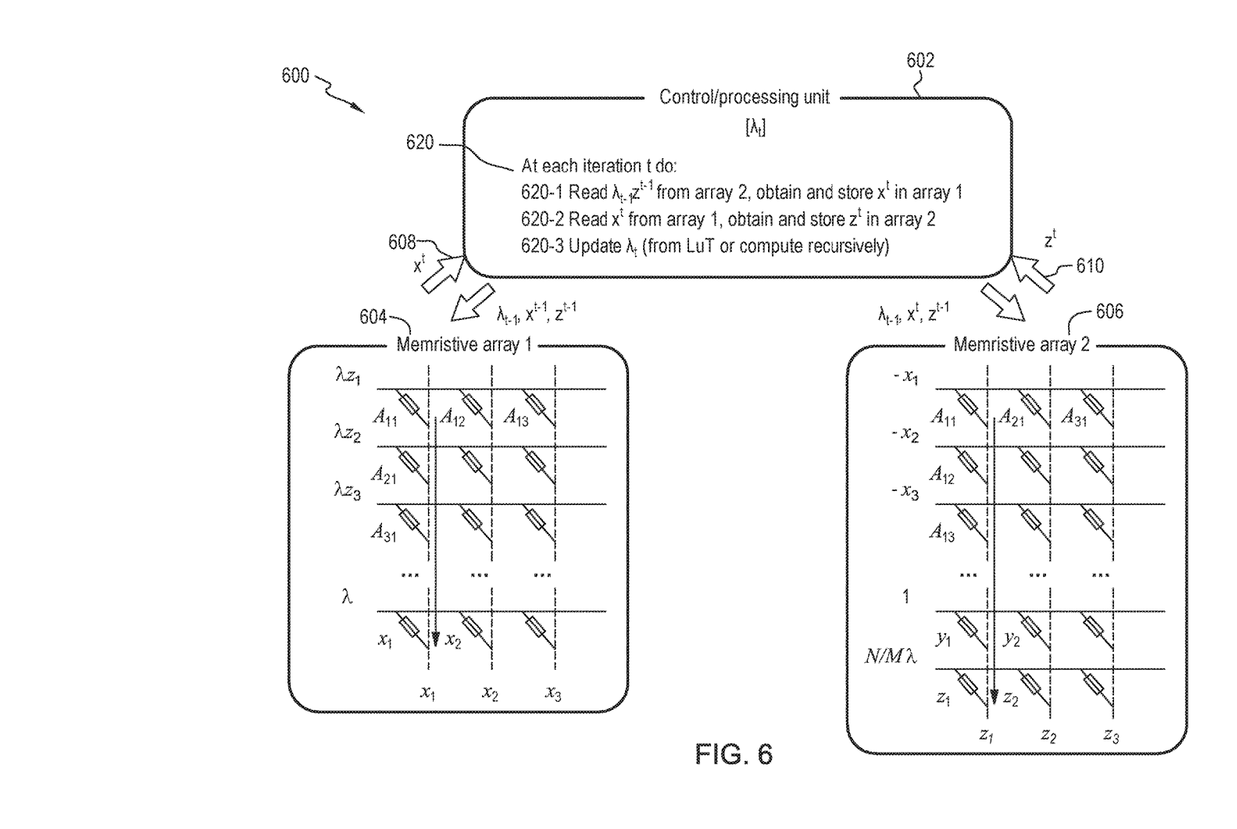
FIG. 6 is an exemplary block diagram of a system utilizing approximate message passing computation, wherein the computation may be performed using resistive memory networks.

An exemplary block diagram of a system 600 utilizing the AMP technique, wherein the computation may be performed using resistive memory networks, is shown in FIG. 6. System 600 may include control/processing unit 602, memristive array 1 604, memristive array 2 606, communication link 608, and communication link 610. Control/processing unit 602 may control the operation and processing performed by system 600 and may typically be implemented by circuitry including digital combinational logic. Memristive array 1 604 may perform a portion of the computations that implement the AMP technique, and may communicate with control/processing unit 602 using communication link 608. Memristive array 2 606 may perform a portion of the computations that implement the AMP technique, and may communicate with control/processing unit 602 using communication link 610.

Control/processing unit 602 may control the operation and processing performed by system 600 so as to perform an iterative process 620 to implement the AMP technique, and in particular, to compute state variable $\lambda_t$, described above. Process 620 begins at 620-1, in which message $\lambda_{t-1} z^{t-1}$ may be read from array 2 606 via link 610, and message $x^t$ may be computed and stored in array 1 604. For example, message $x^t$ may be computed as $x^t = \lambda_{t-1}(A^* z^{t-1} + x^{t-1})$. At 620-2, message $x^t$ may be read from array 1 604, and message $z^t$ may be computed and stored in array 2 606. For example, message $z^t$ may be computed as $$z^t = y - Ax^t + \frac{N}{M} z^{t-1} \lambda_{t-1}.$$

At 620-3, the value of state variable $\lambda_t$ may be updated, for example using a look-up table or by recursive computation. Process 620 may be iterated until the value of state variable $\lambda_t$ converges, or based on other completion criteria. It may be noted that $y_i$ is of the order of $M^{1/2} A_{ij}$. Accordingly, system 600 may require a high dynamic range of conductance of the memristors to code A and y in the same array when M is large.

Figure 7:
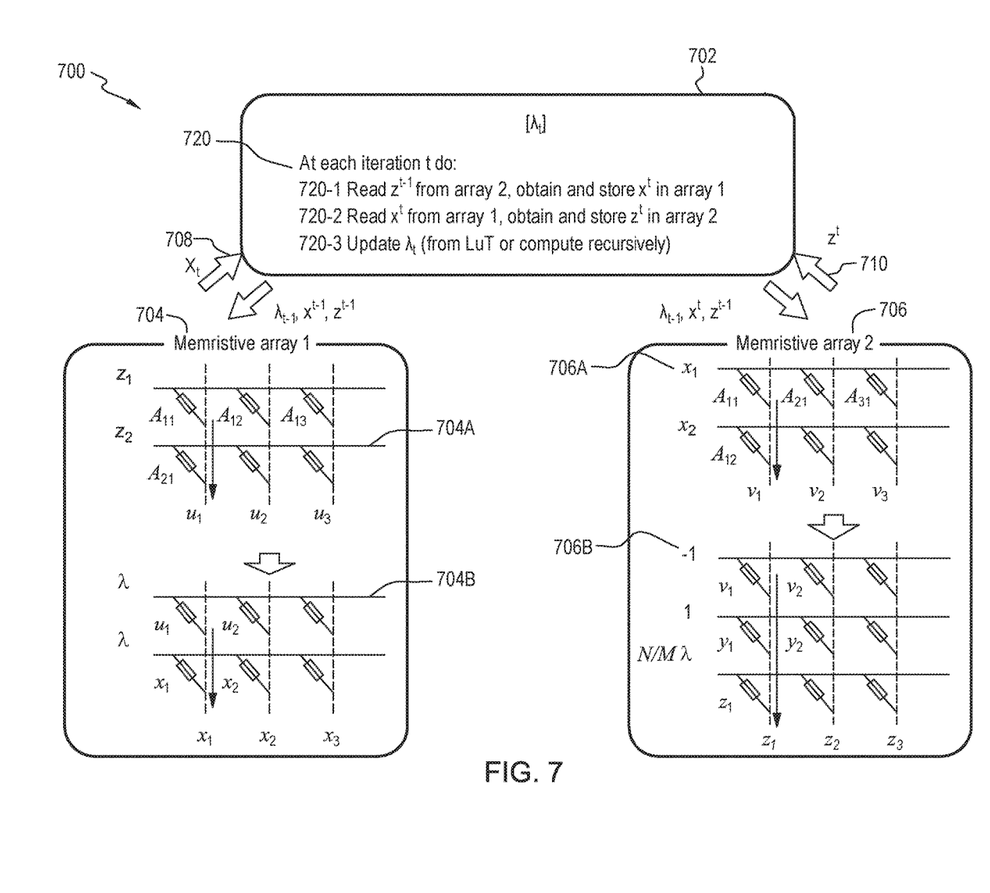
FIG. 7 is an exemplary block diagram of a system utilizing approximate message passing computation, wherein the computation may be performed using resistive memory networks.

An exemplary block diagram of a system 700 utilizing the AMP technique, wherein the computation may be performed using resistive memory networks, is shown in FIG. 7. In this example, the need for high dynamic range may be avoided by a two-step process, in which matrix-vector computations are performed first, followed by the final additions in a second step. System 700 may include control/processing unit 702, memristive array 1 704, memristive array 2 706, communication link 708, and communication link 710. Control/processing unit 702 may control the operation and processing performed by system 700 and may typically be implemented by circuitry including digital combinational logic. Memristive array 1 704 may perform a portion of the computations that implement the AMP technique, and may communicate with control/processing unit 702 using communication link 708. Memristive array 2 706 may perform a portion of the computations that implement the AMP technique, and may communicate with control/processing unit 702 using communication link 710.

Control/processing unit 702 may control the operation and processing performed by system 700 so as to perform an iterative process 720 to implement the AMP technique, and in particular, to compute state variable $\lambda_t$, described above. Process 720 begins at 720-1, in which message $z^{t-1}$ may be read from array 2 706 via link 710, and message $x^t$ may be computed and stored in array 1 704. For example, message $x^t$ may be computed as $x^t=\lambda_{t-1}(A^*z^{t-1}+x^{t-1})$, where intermediate message $u^t=A^*z^{t-1}$. At 720-2, message $x^t$ may be read from array 1 704, and message $z^t$ may be computed and stored in array 2 706. For example, message $z^t$ may be computed as $$z^t = y - Ax^t + \frac{N}{M}z^{t-1}\lambda_{t-1},$$

where intermediate message $v^t=Ax^t$. At 720-3, the value of state variable $\lambda_t$ may be updated, for example using a look-up table or by recursive computation. Process 720 may be iterated until the value of state variable $\lambda_t$ converges, or based on other completion criteria. In this example, memristive array 1 704 may include two blocks of computational circuitry, 706A, 706B. Block 704A may compute the intermediate message $u^t$, which may then be used by block 704B to compute message $x^t$. Block 706A may compute the intermediate message $v^t$, which may then be used by block 706B to compute message $z^t$.

Figure 8:
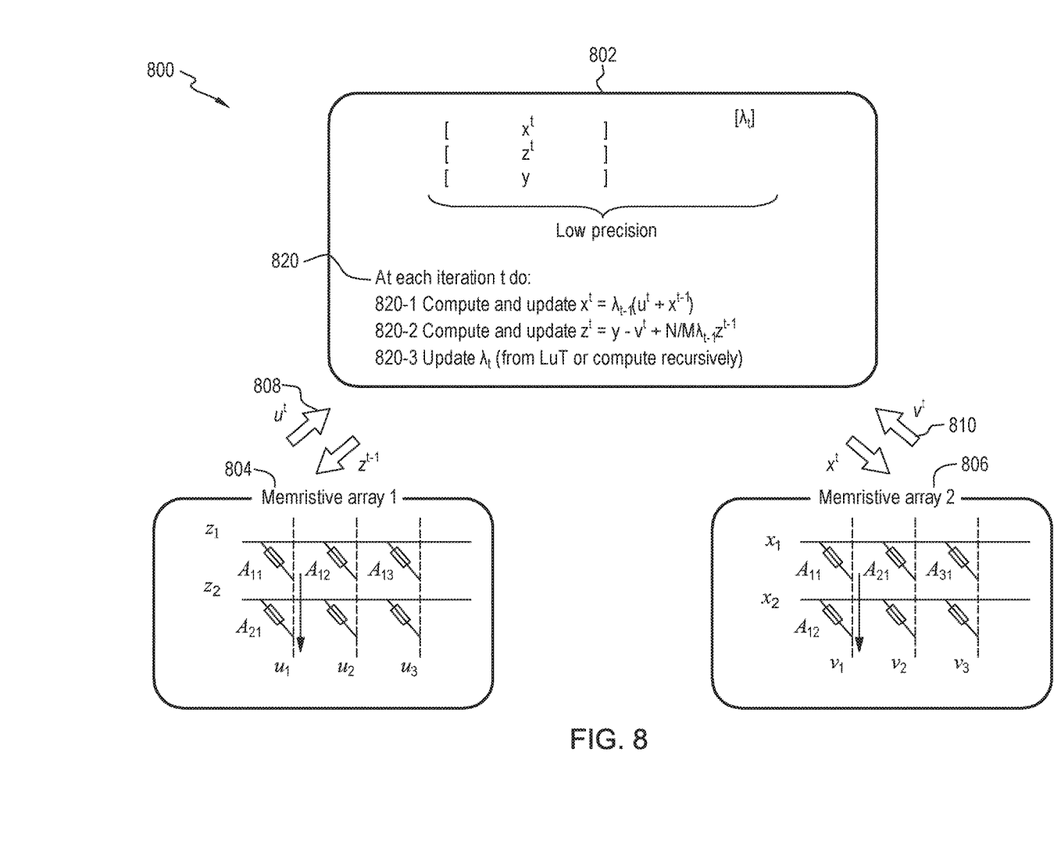
FIG. 8 is an is an exemplary block diagram of a system utilizing approximate message passing computation, wherein the computation may be performed using resistive memory networks and digital combination logic.

An exemplary block diagram of a system 800 utilizing the AMP technique, wherein the computation may be performed using a hybrid of resistive memory networks and digital combinational logic, is shown in FIG. 8. System 800 may include control/processing unit 802, memristive array 1 804, memristive array 2 806, communication link 808, and communication link 810. Control/processing unit 802 may control the operation and processing performed by system 800 and may typically be implemented by circuitry including digital combinational logic. Memristive array 1 804 may perform a portion of the computations that implement the AMP technique, and may communicate with control/processing unit 802 using communication link 808. Memristive array 2 806 may perform a portion of the computations that implement the AMP technique, and may communicate with control/processing unit 802 using communication link 810. In this example, the matrix-vector computations may be done in the memristive arrays 804, 806. The vectors x and z may be stored and updated in the control/processing unit 802 in low precision, such as 8-16 bits of precision. Typically, the on-chip memory in the processing unit 802 may have faster access times and lower latency than the memristive arrays 804, 806 and also storing x and z in the control/processing unit 802 may avoid reprogramming of the memristive arrays 804, 806.

Control/processing unit 802 may control the operation and processing performed by system 800 so as to perform an iterative process 820 to implement the AMP technique, and in particular, to compute $\lambda_t$, described above. Process 820 begins at 820-1, in which $x^t$ may be computed and updated. For example, message $x^t$ may be computed as $x^t=\lambda_{t-1}(u^t+x^{t-1})$, where $u^t=A^*z^{t-1}$. Accordingly, message $z^{t-1}$ may be communicated from control/processing unit 802 to array 1 804 over link 808, intermediate message $u^t$ may be computed in array 1 804, and intermediate message $u^t$ may be communicated to control/processing unit 802 over link 808. Control/processing unit 802 may then compute and update message $x^t$ using intermediate message $u^t$. At 820-2, message $z^t$ may be computed and stored in array 2 806. For example, message $z^t$ may be computed as $$z^t = y - v^t + \frac{N}{M}z^{t-1}\lambda_{t-1},$$

where $v^t=Ax^t$. Accordingly, message $x^t$ may be communicated from control/processing unit 802 to array 2 806 over link 810, intermediate message $v^t$ may be computed in array 1 804, and intermediate message $v^t$ may be communicated to control/processing unit 802 over link 808. Control/processing unit 802 may then compute and update message $z^t$ using intermediate message $v^t$. At 820-3, the value of state variable $\lambda_t$ may be updated, for example using a look-up table or by recursive computation. Process 820 may be iterated until the value of state variable $\lambda_t$ converges, or based on other completion criteria.

An embodiment of the present invention has been described for a linear function $$\eta_t(\cdot) = \lambda_t \times (\cdot).$$

Note that other choices of the function $\eta_t(\cdot)$ may be considered. For example, the AMP technique may be used to reconstruct a random vector $s \in \mathbb{R}^N$ that is sparse, i.e., only K<N vector elements are nonzero. In this case, a nonlinear function $\eta_t(\cdot)$ may be preferably used, e.g., $$\eta_t(x) = \begin{cases} x - \lambda\theta_t, & x \geq \lambda\theta \\ x + \lambda\theta_t, & x \leq -\lambda\theta_t \\ 0, & \text{otherwise} \end{cases}$$

where $\lambda$ is a positive constant and $\theta_t$ may be estimated empirically from state evolution or read from a look-up table.

Figure 9:
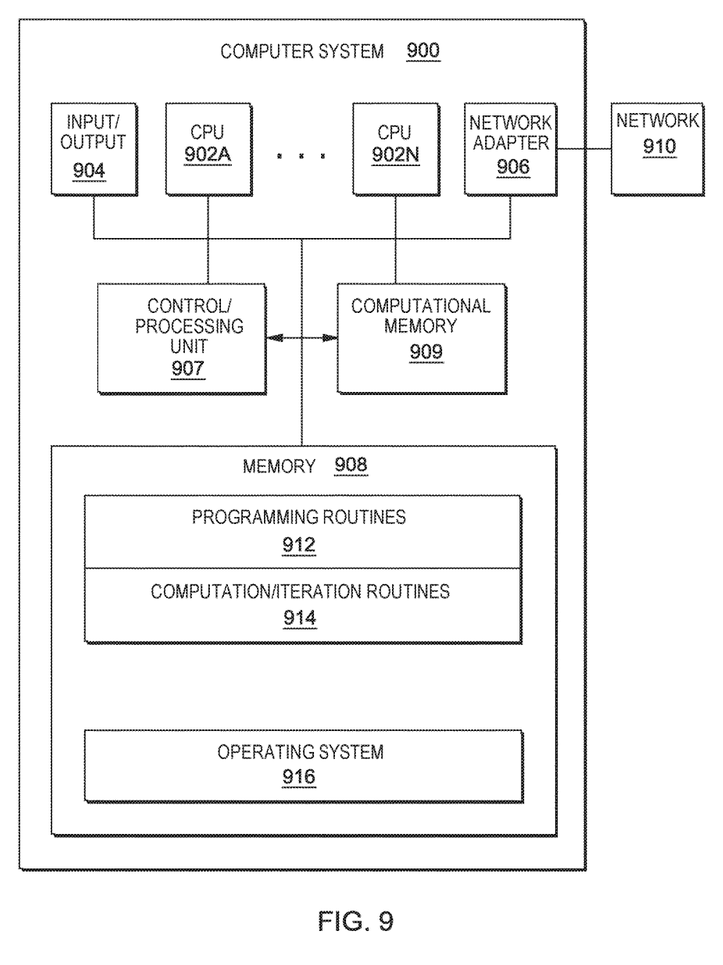
FIG. 9 is an exemplary block diagram of a computer system in which processes involved in the embodiments described herein may be implemented.

An exemplary block diagram of a computer system 900, in which embodiments described herein may be implemented, is shown in FIG. 9. Computer system 900 typically includes a programmed general-purpose computer system, such as an embedded processor, system on a chip, personal computer, workstation, server system, and minicomputer or mainframe computer. Computer system 900 may include one or more processors (CPUs) 902A-902N, input/output circuitry 904, network adapter 906, control/processing unit 907, memory 908, and computational memory 909. CPUs 902A-902N execute program instructions in order to carry out the functions of the present invention. Typically, CPUs 902A-902N are one or more microprocessors, such as an INTEL PENTIUM® processor. FIG. 9 illustrates an embodiment in which computer system 900 is implemented as a single multi-processor computer system, in which multiple processors 902A-902N share system resources, such as memory 908, input/output circuitry 904, and network adapter 906. However, the present invention also contemplates embodiments in which computer system 900 is implemented as a plurality of networked computer systems, which may be single-processor computer systems, multi-processor computer systems, or a mix thereof.

Input/output circuitry 904 provides the capability to input data to, or output data from, computer system 900. For example, input/output circuitry may include input devices, such as keyboards, mice, touchpads, trackballs, scanners, analog to digital converters, etc., output devices, such as video adapters, monitors, printers, etc., and input/output devices, such as, modems, etc. Network adapter 906 interfaces device 900 with a network 910. Network 910 may be any public or proprietary LAN or WAN, including, but not limited to the Internet.

Control/processing unit 907 may include a digital combinational electronic circuitry to control the operation and processing performed by computational memory 909. Computational memory 909 may be memory structured to perform basic computational operations or primitives. Control/processing unit 907 and computational memory 909 may be implemented as electronic circuitry separate from CPUs 902A-902N, as in the example shown in FIG. 9, or control/processing unit 907 and computational memory 909 may be circuitry included in CPUs 902A-902N. Likewise, there may be embodiments in which one or more CPUs 902A-902N perform the functions of control/processing unit 907. The present invention contemplates any and all such arrangements of components.

Memory 908 stores program instructions that are executed by, and data that are used and processed by, CPU 902 to perform the functions of computer system 900. Memory 908 may include, for example, electronic memory devices, such as random-access memory (RAM), read-only memory (ROM), programmable read-only memory (PROM), electrically erasable programmable read-only memory (EEPROM), flash memory, etc., and electro-mechanical memory, such as magnetic disk drives, tape drives, optical disk drives, etc., which may use an integrated drive electronics (IDE) interface, or a variation or enhancement thereof, such as enhanced IDE (EIDE) or ultra-direct memory access (UDMA), or a small computer system interface (SCSI) based interface, or a variation or enhancement thereof, such as fast-SCSI, wide-SCSI, fast and wide-SCSI, etc., or Serial Advanced Technology Attachment (SATA), or a variation or enhancement thereof, or a fiber channel-arbitrated loop (FC-AL) interface.

The contents of memory 908 may vary depending upon the function that computer system 900 is programmed to perform. However, one of skill in the art would recognize that routines implementing such functions, along with the memory contents related to those routines, may not be included on one system or device, but rather may be distributed among a plurality of systems or devices, based on well-known engineering considerations. The present invention contemplates any and all such arrangements.

In the example shown in FIG. 9, memory 908 may include programming routines 912, computation/iteration routines 914, and operating system 916. For example, programming routines 912 may include routines that program memory elements, such as resistive memory elements, in computational memory 909. Computation/iteration routines 914 may include routines perform computations using control/processing unit 907 and computational memory 909, and to perform any needed iteration. Operating system 916 provides overall system functionality.

As shown in FIG. 9, the present invention contemplates implementation on a system or systems that provide multi-processor, multi-tasking, multi-process, and/or multi-thread computing, as well as implementation on systems that provide only single processor, single thread computing. Multi-processor computing involves performing computing using more than one processor. Multi-tasking computing involves performing computing using more than one operating system task. A task is an operating system concept that refers to the combination of a program being executed and bookkeeping information used by the operating system. Whenever a program is executed, the operating system creates a new task for it. The task is like an envelope for the program in that it identifies the program with a task number and attaches other bookkeeping information to it. Many operating systems, including Linux, UNIX®, OS/2®, and Windows®, are capable of running many tasks at the same time and are called multitasking operating systems. Multitasking is the ability of an operating system to execute more than one executable at the same time. Each executable is running in its own address space, meaning that the executables have no way to share any of their memory. This has advantages, because it is impossible for any program to damage the execution of any of the other programs running on the system. However, the programs have no way to exchange any information except through the operating system (or by reading files stored on the file system). Multi-process computing is similar to multi-tasking computing, as the terms task and process are often used interchangeably, although some operating systems make a distinction between the two.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A computing system comprising:
   a computational memory comprising a first memristive array and a second memristive array, each said first and second memristive array comprising a plurality of memristive devices arranged in a crossbar topology;
   digital combinational control circuitry adapted to perform read and write operations on the first and second memristive arrays, said control circuitry performing an approximate message passing process by communicating messages with the first memristive array over a first communications link and communicating messages with the second memristive array over a second communications link, said communicated messages including parameters of a probability distribution function of a variable and said control circuitry storing at least one state variable of the approximate message passing process, said control circuitry iteratively performing computations using the first and second memristive arrays to compute said at least one state variable; and
   said first memristive array and second memristive array generating an output representing a result of a computation of the approximate message passing process.

2. The computing system of claim 1, wherein the control circuitry comprises circuitry to compute the at least one state variable or fetch a value of the at least one state variable from a look-up table.

3. The computing system of claim 1, wherein the first and second memristive array comprises circuitry adapted to compute at least one message of the approximate message passing process.

4. The computing system of claim 1, wherein the first memristive array computes an intermediate message and the second memristive array computes the at least one message of the approximate message passing process.

5. The computing system of claim 1, wherein the first and second memristive array comprises circuitry adapted to compute an intermediate message and the control circuitry computes the at least one message of the approximate message passing process.

6. The computing system of claim 1, wherein the computational memory comprises an array of resistive memory elements having resistance or conductance values stored therein, the respective resistance or conductance values being programmable.

7. The computing system of claim 1, wherein said approximate message passing process performs a matrix multiplication for solving a system of linear equations, said first memristive array defines variable nodes and the second memristive array defines function nodes, said communicated messages comprising a mean and variance of random variables exchanged between said function nodes and variable nodes.

8. A computer program product for performing computation comprising a non-transitory computer readable storage having program instructions embodied therewith, the program instructions executable by a control processor circuit, to cause the control processor circuit to perform a method comprising:

performing read and write operations on a computational memory, wherein the computational memory comprises a first memristive array and a second memristive array, each said first and second memristive arrays comprising a plurality of memristive devices arranged in a crossbar topology;

performing an approximate message passing process using the first and second memristive arrays, said control processor circuit communicating messages with the first memristive array over a first communications link and communicating messages with the second memristive array over a second communications link, said messages including parameters of a probability distribution function of a variable, said control processor circuit iteratively performing computations using the first and second memristive arrays to compute and store at least one state variable; and outputting from the first and second memristive arrays a result of the computation of the approximate message passing process.

9. The computer program product of claim 8, further comprising program instructions to cause the control circuitry to compute the at least one state variable or fetch a value of the at least one state variable from a look-up table.

10. The computer program product of claim 8, wherein the first and second memristive array computes at least one message of the approximate message passing process.

11. The computer program product of claim 8, wherein the first memristive array computes an intermediate message and the second memristive array computes the at least one message of the approximate message passing process.

12. The computer program product of claim 8, wherein the first and second memristive array computes an intermediate message and the control circuitry computes the at least one message of the approximate message passing process.

13. The computer program product of claim 8, wherein said approximate message passing process performs a matrix multiplication for solving a system of linear equations, said first memristive array defining variable nodes and the second memristive array defining function nodes, said communicated messages comprising a mean and variance of random variables exchanged between said function nodes and variable nodes.

14. A computer-implemented method for performing computation comprising:

performing, using a control processor circuit, read and write operations on a computational memory, wherein the computational memory comprises a first memristive array and a second memristive array, each said first and second memristive arrays comprising a plurality of memristive devices arranged in a crossbar topology;

performing, by the control processor circuit, an approximate message passing process computation using the first and second memristive arrays, said control processor circuit communicating messages with the first memristive array over a first communications link and communicating messages with the second memristive array over a second communications link, said messages including parameters of a probability distribution function of a variable, said control processor circuit for iteratively performing computations using the first and second memristive arrays to compute and store at least one state variable; and outputting from the first and second memristive array a result of the computation of the approximate message passing process.

15. The method of claim 14, further comprising:

computing the at least one state variable using the control circuitry or fetching a value of the at least one state variable from a look-up table using the control circuitry.

16. The method of claim 14, wherein the first and second memristive array computes at least one message of the approximate message passing process.

17. The method of claim 14, wherein the first memristive array computes an intermediate message and a second memristive array computes the at least one message of the approximate message passing process.

18. The method of claim 14, wherein the first and second memristive array computes an intermediate message and the control circuitry comprises circuitry to compute the at least one message of the approximate message passing process.

19. The method of claim 14, wherein said approximate message passing process performs a matrix multiplication for solving a system of linear equations, said first memristive array defining variable nodes and the second memristive array defining function nodes, said communicated messages comprising a mean and variance of random variables exchanged between said function nodes and variable nodes.

* * * * *